(12) United States Patent
Eom et al.

(10) Patent No.: US 9,742,355 B2
(45) Date of Patent: Aug. 22, 2017

(54) BUFFER CIRCUIT ROBUST TO VARIATION OF REFERENCE VOLTAGE SIGNAL

(71) Applicant: SAMSUNG ELECTRONICS CO., LTD., Suwon-si, Gyeonggi-do (KR)

(72) Inventors: Yoon-Joo Eom, Hwaseong-si (KR); Seung-Jun Bae, Hwaseong-si (KR); Dae-Sik Moon, Suwon-si (KR); Joon-Young Park, Seoul (KR); Min-Su Ahn, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/959,195

(22) Filed: Dec. 4, 2015

(65) Prior Publication Data

US 2016/0164479 A1 Jun. 9, 2016

(30) Foreign Application Priority Data

Dec. 5, 2014 (KR) ........................ 10-2014-0173680

(51) Int. Cl.
  *H03F 3/45* (2006.01)
  *H03D 7/14* (2006.01)
  *H03K 19/003* (2006.01)

(52) U.S. Cl.
  CPC ....... *H03D 7/1441* (2013.01); *H03F 3/45183* (2013.01); *H03K 19/00361* (2013.01); *H03F 2203/45051* (2013.01); *H03F 2203/45466* (2013.01); *H03F 2203/45674* (2013.01); *H03F 2203/45702* (2013.01)

(58) Field of Classification Search
  CPC .......... H03F 3/45; H03F 3/68; H03F 2200/06; H03F 2200/09
  USPC ........................ 330/69, 124 R, 253, 295, 301
  See application file for complete search history.

(56) References Cited

U.S. PATENT DOCUMENTS

| 6,590,429 | B2 | 7/2003 | Choi et al. | |
| 6,777,985 | B2 | 8/2004 | Moon et al. | |
| 6,794,934 | B2 * | 9/2004 | Betti-Berutto | H03F 1/18 330/124 R |
| 7,157,965 | B1 * | 1/2007 | Kim | H03F 3/602 330/124 R |
| 7,778,374 | B2 | 8/2010 | Jeon | |
| 7,880,510 | B2 | 2/2011 | Do | |

(Continued)

FOREIGN PATENT DOCUMENTS

| KR | 1998-0075142 A | 11/1998 |
| KR | 0417857 B | 1/2004 |

(Continued)

*Primary Examiner* — Steven J Mottola
(74) *Attorney, Agent, or Firm* — Volentine & Whitt, PLLC

(57) ABSTRACT

A buffer circuit includes a first differential amplifier, second differential amplifier, third differential amplifier, and mixer. The first differential amplifier generates a positive differential signal and a negative differential signal based on an input signal and a reference voltage signal. The second differential amplifier generates a first signal based on the positive differential signal and the negative differential signal. The third differential amplifier generates a second signal having a different phase from the first signal based on the positive differential signal and the negative differential signal. The mixer outputs a signal, generated by mixing the first signal and the second signal, as an output signal.

18 Claims, 11 Drawing Sheets

(56) References Cited

U.S. PATENT DOCUMENTS

| | | |
|---|---|---|
| 7,999,611 B2 | 8/2011 | Kim et al. |
| 8,565,037 B2 | 10/2013 | Amirabadi |
| 2013/0328629 A1 | 12/2013 | Jung |
| 2015/0349732 A1* | 12/2015 | Leong .................... H03F 1/565 |
| | | 330/253 |

FOREIGN PATENT DOCUMENTS

| KR | 2007-0099888 A | 10/2007 |
|---|---|---|
| KR | 2011-0060607 A | 6/2011 |

* cited by examiner

BUFFER CIRCUIT ROBUST TO VARIATION OF REFERENCE VOLTAGE SIGNAL

CROSS-REFERENCE TO RELATED APPLICATION

This U.S. non-provisional application claims priority under 35 USC §119 to Korean Patent Application No. 10-2014-0173680, filed on Dec. 5, 2014, in the Korean Intellectual Property Office (KIPO), the disclosure of which is incorporated by reference in its entirety herein.

BACKGROUND

1. Technical Field

Example embodiments relate generally to a buffer circuit, and more particularly to a buffer circuit which is robust to variation of a reference voltage signal.

2. Discussion of the Related Art

A differential amplifier denotes a circuit which has two input terminals and at least one output terminal, and generates an output signal by amplifying the difference between the two input signals. The differential amplifier is a basic functional block of an analog integrated circuit, and is used in a buffer circuit.

A duty of an output signal of the buffer circuit is degraded when there's a variation on a reference voltage signal provided as an input signal to a differential amplifier used in the buffer circuit.

SUMMARY

At least one example embodiment of the disclosure provides a buffer circuit generating an output signal which maintains the same or similar duty with an input signal by mixing differential signals generated by differential amplification of the input signal even when there's variation on a reference voltage signal.

At least one example embodiment of the disclosure provides a buffer circuit which generates an output signal by normal differential amplification when variation of a reference voltage signal is relatively small, and generates the output signal which maintains the same or similar duty with an input signal by mixing differential signals generated by differential amplification of the input signal when the variation of the reference voltage signal is relatively large.

According to example embodiments, a buffer circuit includes a first differential amplifier, a second differential amplifier, a third differential amplifier, and a mixer. The first differential amplifier generates a positive differential signal and a negative differential signal based on an input signal and a reference voltage signal. The second differential amplifier generates a first signal based on the positive differential signal and the negative differential signal. The third differential amplifier generates a second signal having a different phase from the first signal based on the positive differential signal and the negative differential signal. The mixer outputs a signal, generated by mixing the first signal and the second signal, as an output signal.

In an example embodiment, the buffer circuit may maintain a difference between a duty of the output signal and a duty of the input signal within a certain range by cancelling duty variations of the positive differential signal and the negative differential signal through the mixing when a level of the reference voltage signal is varied.

In an example embodiment, a difference between a phase of the first signal and a phase of the second signal may be 180 degrees.

In an example embodiment, the mixer may include a first inverter and an internal mixer. The first inverter may generate an inverted second signal by inverting the second signal. The internal mixer may generate the output signal by mixing the first signal and the inverted second signal.

In an example embodiment, the internal mixer may include a first node. The first signal and the inverted second signal may be provided to the first node and the output signal may be outputted from the first node.

In an example embodiment, the internal mixer may include second and third inverters. An input terminal of the second inverter may be connected to a first node and an output terminal of the second inverter may be connected to a second node. An input terminal of the third inverter may be connected to the second node and an output terminal of the third inverter may be connected to the first node. The first signal may be provided to the first node, the inverted second signal may be provided to the second node, and the output signal may be outputted from the first node.

In an example embodiment, the first differential amplifier may include first and second NMOS transistors, first and second resistors, and a current source. A terminal of the first resistor may receive a supply voltage, the other terminal of the first resistor may be connected to a first node, a terminal of the second resistor may receive the supply voltage, the other terminal of the second resistor may be connected to a second node, the negative differential signal may be outputted from the first node, and the positive differential signal may be outputted from the second node. A drain terminal of the first NMOS transistor may be connected to the first node, a gate terminal of the first NMOS transistor may receive the input signal, and a source terminal of the first NMOS transistor may be connected to a third node. A drain terminal of the second NMOS transistor may be connected to the second node, a gate terminal of the second NMOS transistor may receive the reference voltage signal, and a source terminal of the second NMOS transistor may be connected to the third node. A terminal of the current source may be connected to the third node and the other terminal of the current source may receive a ground voltage.

In an example embodiment, the current source may include a third NMOS transistor. A drain terminal of the third NMOS transistor may be connected to the third node, a gate terminal of the third NMOS transistor may receive a bias voltage signal, and a source terminal of the third NMOS transistor may receive the ground voltage.

In an example embodiment, an amount of a current, generated by the current source, may be determined according to a level of the bias voltage signal.

In an example embodiment, the second differential amplifier may include first and second PMOS transistors, first and second NMOS transistors, and a current source. A drain terminal of the first PMOS transistor may receive a supply voltage, a gate terminal of the first PMOS transistor may be connected to a first node, and a source terminal of the first PMOS transistor may be connected to the first node. A drain terminal of the second PMOS transistor may receive the supply voltage, a gate terminal of the second PMOS transistor may be connected to the first node, a source terminal of the second PMOS transistor may be connected to a second node, and the first signal may be outputted from the second node. A drain terminal of the first NMOS transistor may be connected to the first node, a gate terminal of the first NMOS transistor may receive the positive differential signal, and a source terminal of the first NMOS transistor may be connected to a third node. A drain terminal of the second NMOS transistor may be connected to the second node, a gate terminal of the second NMOS transistor may receive the negative differential signal, and a source terminal of the second NMOS transistor may be connected to the third node. A terminal of the current source may be connected to the third node and the other terminal of the current source may receive a ground voltage.

In an example embodiment, the third differential amplifier may include first and second PMOS transistors, first and second NMOS transistors, and a current source. A drain terminal of the first PMOS transistor may receive a supply voltage, a gate terminal of the first PMOS transistor may be connected to a first node, and a source terminal of the first PMOS transistor may be connected to the first node. A drain terminal of the second PMOS transistor may receive the supply voltage, a gate terminal of the second PMOS transistor may be connected to the first node, a source terminal of the second PMOS transistor may be connected to a second node, and the second signal may be outputted from the second node. A drain terminal of the first NMOS transistor may be connected to the first node, a gate terminal of the first NMOS transistor may receive the negative differential signal, and a source terminal of the first NMOS transistor may be connected to a third node. A drain terminal of the second NMOS transistor may be connected to the second node, a gate terminal of the second NMOS transistor may receive the positive differential signal, and a source terminal of the second NMOS transistor may be connected to the third node. A terminal of the current source may be connected to the third node and the other terminal of the current source may receive a ground voltage.

According to example embodiments, a buffer circuit includes a first differential amplifier, a second differential amplifier, a third differential amplifier, and a mixer. The first differential amplifier generates a positive differential signal and a negative differential signal based on an input signal and a reference voltage signal. The second differential amplifier generates a first signal based on the positive differential signal and the negative differential signal. The second differential amplifier drives the first signal with a first current amount when a mode signal is deactivated. The second differential amplifier drives the first signal with a second current amount, which is a half of the first current amount, when the mode signal is activated. The third differential amplifier stops operating when the mode signal is deactivated. The third differential amplifier generates a second signal, which has the second current amount and has a different phase from the first signal, based on the positive differential signal and the negative differential signal when the mode signal is activated. The mixer outputs the first signal as an output signal when the mode signal is deactivated. The mixer outputs a signal, generated by mixing the first signal and the second signal, as the output signal when the mode signal is activated.

In an example embodiment, the buffer circuit may maintain a difference between a duty of the output signal and a duty of the input signal within a certain range by cancelling duty variations of the positive differential signal and the negative differential signal through the mixing when a level of the reference voltage signal is varied and the mode signal is activated.

In an example embodiment, the mixer may include a first inverter and an internal mixer. The first inverter may generate an inverted second signal by inverting the second signal. The internal mixer may generate the output signal by mixing the first signal and the inverted second signal.

In an example embodiment, the internal mixer may include an NMOS transistor. The first signal may be provided to a first node, a drain terminal of the NMOS transistor may be connected to the first node, a gate terminal of the NMOS transistor may receive the mode signal, a source terminal of the NMOS transistor may receive the inverted second signal, and the output signal may be outputted from the first node.

In an example embodiment, the internal mixer may include an NMOS transistor and second and third inverters. A drain terminal of the NMOS transistor may be connected to a first node, a gate terminal of the NMOS transistor may receive the mode signal, and a source terminal of the NMOS transistor may be connected to a second node. An input terminal of the second inverter may be connected to the second node and an output terminal of the second inverter may be connected to a third node. An input terminal of the third inverter may be connected to the third node and an output terminal of the third inverter may be connected to the second node. The first signal may be provided to the first node, the inverted second signal may be provided to the third node, and the output signal may be outputted from the first node.

In an example embodiment, the first inverter may generate the inverted second signal having the same current amount as the second signal.

In an example embodiment, a difference between a phase of the first signal and a phase of the second signal may be 180 degrees.

In an example embodiment, the second differential amplifier may include first and second PMOS transistors, first and second NMOS transistors, and a current source. A drain terminal of the first PMOS transistor may receive a supply voltage, a gate terminal of the first PMOS transistor may be connected to a first node, and a source terminal of the first PMOS transistor may be connected to the first node. A drain terminal of the second PMOS transistor may receive the supply voltage, a gate terminal of the second PMOS transistor may be connected to the first node, a source terminal of the second PMOS transistor may be connected to a second node, and the first signal may be outputted from the second node. A drain terminal of the first NMOS transistor may be connected to the first node, a gate terminal of the first NMOS transistor may receive the positive differential signal, and a source terminal of the first NMOS transistor may be connected to a third node. A drain terminal of the second NMOS transistor may be connected to the second node, a gate terminal of the second NMOS transistor may receive the negative differential signal, and a source terminal of the second NMOS transistor may be connected to the third node. A terminal of the current source may be connected to the third node, the other terminal of the current source may receive a ground voltage, the current source may generate a current having the first current amount when the mode signal is deactivated, and the current source may generate the current having the second current amount when the mode signal is activated.

In an example embodiment, the third differential amplifier may include first and second PMOS transistors, first through third NMOS transistors, and a current source. A drain terminal of the first NMOS transistor may receive a supply voltage, a gate terminal of the first PMOS transistor may be connected to a first node, and a source terminal of the first PMOS transistor may be connected to the first node. A drain terminal of the second PMOS transistor may receive the supply voltage, a gate terminal of the second PMOS transistor may be connected to the first node, a source terminal of the second PMOS transistor may be connected to a second node, and the second signal may be outputted from the second node. A drain terminal of the first NMOS transistor may be connected to the first node, a gate terminal of the first NMOS transistor may receive the negative differential signal, and a source terminal of the first NMOS transistor may be connected to a third node. A drain terminal of the second NMOS transistor may be connected to the second node, a gate terminal of the second NMOS transistor may receive the positive differential signal, and a source terminal of the second NMOS transistor may be connected to the third node. A terminal of the current source may be connected to the third node and the other terminal of the current source may be connected to a fourth node. A drain terminal of the third NMOS transistor may be connected to the fourth node, a gate terminal of the third NMOS transistor may receive the mode signal, and a source terminal of the third NMOS transistor may receive a ground voltage.

In an example embodiment, the mode signal may be deactivated when a difference between a voltage level of the reference voltage signal and half a supply voltage level is equal to or less than a pre-determined reference. The mode signal may be activated when the difference is larger than the pre-determined reference.

According to example embodiments, a buffer circuit includes a differential amplifier that generates a positive differential signal and a negative differential signal based on an input signal and a reference signal. A first buffering component receives the positive and negative differential signals and outputs a first buffered signal based on the received positive and negative differential signals. A second buffering component receives the positive and negative differential signals and outputs a second buffered signal based on the received positive and negative differential signals. A combiner combines the magnitudes of the first and second buffered signals to produce an output signal.

In an example embodiment, the combiner inverts one of the first and second buffered signals to produce an inverted signal and combines the inverted signal and the non-inverted one of the first and second buffered signals to produce the output signal.

In an example embodiment, the combiner produces the output signal based on an average of the magnitudes of the electrical currents within the first and second buffered signals.

In an example embodiment, the first buffered signal has a first amount of current for a first mode of operation and a second amount of current for a second mode of operation and the second buffered signal has the first amount of current for the first mode of operation and a third amount of current for the second mode of operation.

In an example embodiment, the first amount of current is about one-half the second amount of current and the third current is about zero current.

According to example embodiments, a method of maintaining the duty cycle of a signal to be buffered includes generating, with a differential amplifier, a positive differential signal and a negative differential signal based on an input signal and a reference signal; receiving, with a first buffering component, the positive and negative differential signals and outputting, with the first buffering component, a first buffered signal based on the received positive and negative differential signals; receiving, with a second buffering component, the positive and negative differential signals and outputting, with the second buffering component, a second buffered signal based on the received positive and negative differential signals; and combining, with a combiner, the magnitudes of the first and second buffered signals to produce an output signal.

In an example embodiment, the method further includes inverting, with an inverter, one of the first and second buffered signals to produce an inverted signal. The combiner combines the inverted signal and the non-inverted one of the first and second buffered signals to produce the output signal.

In an example embodiment, the combiner produces the output signal based on an average of the magnitudes of the electrical currents within the first and second buffered signals.

In an example embodiment, the first buffered signal has a first amount of current for a first mode of operation and a second amount of current for a second mode of operation and the second buffered signal has the first amount of current for the first mode of operation and a third amount of current for the second mode of operation.

In an example embodiment, the first amount of current is about one-half the second amount of current and the third current is about zero current.

According to example embodiments, a buffer circuit includes a differential amplifier that generates a positive differential signal and a negative differential signal based on an input signal and a reference signal. An averaging circuit produces an output signal having the average of the duty cycles of the positive differential signal and an inversion of the negative differential signal. Each of the positive and negative differential signals has a duty cycle that is greater than zero and less than one.

According to example embodiments, a method of maintaining the duty cycle of a signal to be buffered includes generating, with a differential amplifier, a positive differential signal and a negative differential signal based on an input signal and a reference signal; and producing, with an averaging circuit, an output signal having the average of the duty cycles of the positive differential signal and an inversion of the negative differential signal. Each of the positive and negative differential signals has a duty cycle that is greater than zero and less than one.

As described above, the buffer circuit according to an example embodiment may generate an output signal which maintains the same or similar duty with an input signal by mixing differential signals generated by differential amplification of the input signal even when there's variation on a reference voltage signal. The buffer circuit according another example embodiment may generate an output signal by normal differential amplification when variation of a reference voltage signal is relatively small, and generate the output signal which maintains the same or similar duty with an input signal by mixing differential signals generated by differential amplification of the input signal when the variation of the reference voltage signal is relatively large.

BRIEF DESCRIPTION OF THE DRAWINGS

Example embodiments of the disclosure will be more clearly understood from the following detailed description taken in conjunction with the accompanying drawings.

DETAILED DESCRIPTION OF THE EMBODIMENTS

Figure 1:
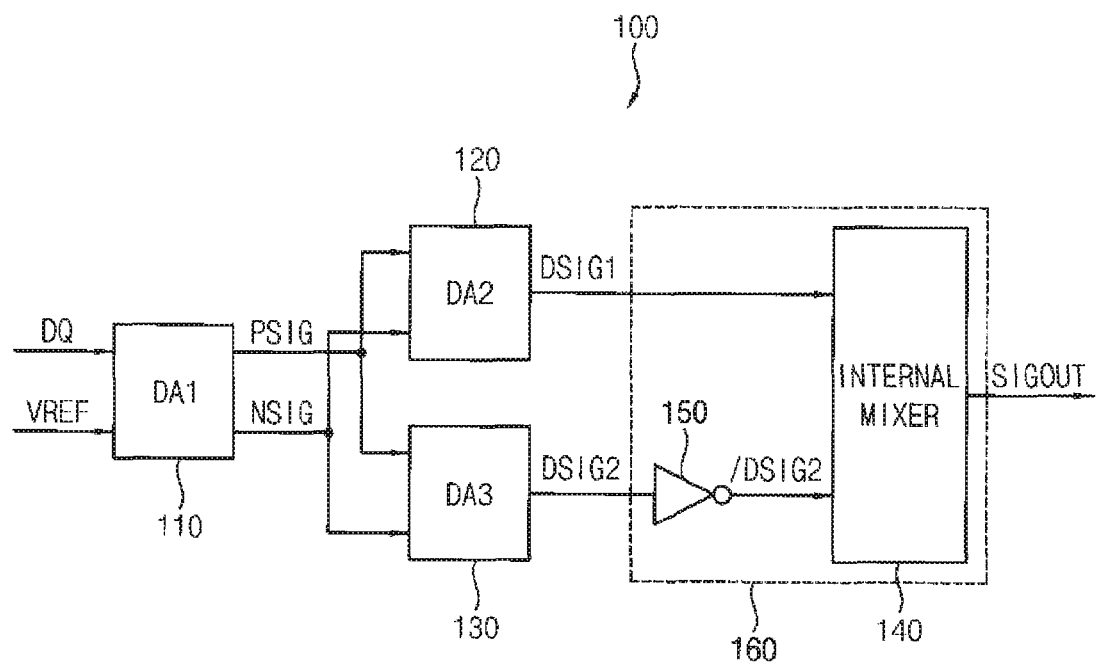
FIG. 1 is a block diagram illustrating a buffer circuit according to an example embodiment.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a buffer circuit according to an example embodiment.

Referring to FIG. 1, a buffer circuit 100 includes a first differential amplifier DA1 110, a second differential amplifier DA2 120, a third differential amplifier DA3 130, and a mixer 160. The mixer 160 includes a first inverter 150 and an internal mixer 140.

The first differential amplifier 110 generates a positive differential signal PSIG and a negative differential signal NSIG based on an input signal DQ and a reference voltage signal VREF. The second differential amplifier 120 generates a first signal DSIG1 based on the positive differential signal PSIG and the negative differential signal NSIG. The third differential amplifier 130 generates a second signal DSIG2 having a different phase from the first signal DSIG1 based on the positive differential signal PSIG and the negative differential signal NSIG. The mixer 160 outputs a signal, generated by mixing the first signal DSIG1 and the second signal DSIG2, as an output signal SIGOUT.

The first inverter 150 may generate an inverted second signal /DSIG2 by inverting the second signal DSIG2. The internal mixer 140 may generate the output signal SIGOUT by mixing the first signal DSIG1 and the inverted second signal /DSIG2.

The buffer circuit 100 may maintain a difference between a duty of the output signal SIGOUT and a duty of the input signal DQ within a certain range by cancelling duty variations of the positive differential signal PSIG and the negative differential signal NSIG through the mixing when a level of the reference voltage signal VREF is varied. Preferably, the buffer circuit 100 may maintain the difference between the duty of the output signal SIGOUT and the duty of the input signal DQ within 2%.

In an example embodiment, a difference between a phase of the first signal DSIG1 and a phase of the second signal DSIG2 may be 180 degrees.

Figure 2:
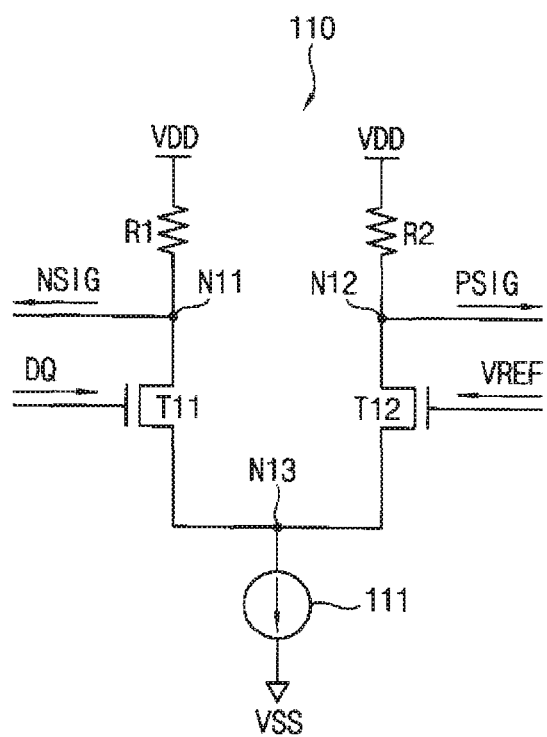
FIG. 2 is a circuit diagram illustrating the first differential amplifier included in the buffer circuit of FIG. 1.

FIG. 2 is a circuit diagram illustrating the first differential amplifier included in the buffer circuit of FIG. 1.

Referring to FIG. 2, the first differential amplifier 110 may include first and second NMOS transistors T11, T12, first and second resistors R1, R2, and a current source 111.

A terminal of the first resistor R1 may receive a supply voltage VDD, the other terminal of the first resistor R1 may be connected to a first node N11, a terminal of the second resistor R2 may receive the supply voltage VDD, the other terminal of the second resistor R2 may be connected to a second node N12, the negative differential signal NSIG may be outputted from the first node N11, and the positive differential signal PSIG may be outputted from the second node N12. A drain terminal of the first NMOS transistor T11 may be connected to the first node N11, a gate terminal of the first NMOS transistor T11 may receive the input signal DQ, and a source terminal of the first NMOS transistor T11 may be connected to a third node N13. A drain terminal of the second NMOS transistor T12 may be connected to the second node N12, a gate terminal of the second NMOS transistor T12 may receive the reference voltage signal VREF, and a source terminal of the second NMOS transistor T12 may be connected to the third node N13. A terminal of the current source 111 may be connected to the third node N13 and the other terminal of the current source 111 may receive a ground voltage VSS.

The first differential amplifier 110 generates the positive differential signal PSIG and the negative differential signal NSIG by amplifying a difference between the input signal DQ and the reference voltage signal VREF. Operation of the signals will be described with the reference to FIG. 8.

Figure 3:
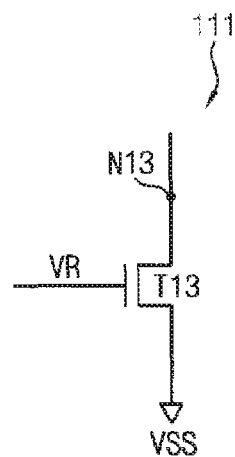
FIG. 3 is a circuit diagram illustrating the current source included in the first differential amplifier of FIG. 2.

FIG. 3 is a circuit diagram illustrating the current source included in the first differential amplifier of FIG. 2.

Referring to FIG. 3, the current source 111 may include a third NMOS transistor T13. A drain terminal of the third NMOS transistor T13 may be connected to the third node N13, a gate terminal of the third NMOS transistor T13 may receive a bias voltage signal VR, and a source terminal of the third NMOS transistor T13 may receive the ground voltage VSS. An amount of a current, generated by the current source 111, may be determined according to a level of the bias voltage signal VR.

Figure 4:
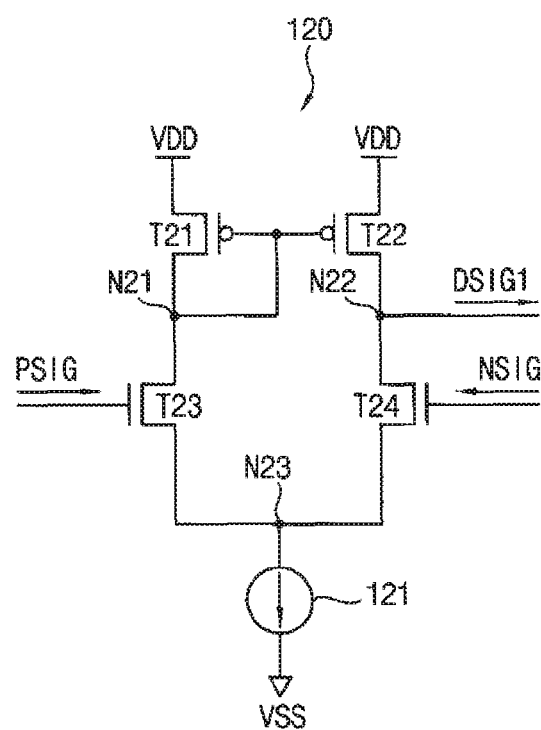
FIG. 4 is a circuit diagram illustrating the second differential amplifier included in the buffer circuit of FIG. 1.

FIG. 4 is a circuit diagram illustrating the second differential amplifier included in the buffer circuit of FIG. 1.

Referring to FIG. 4, the second differential amplifier 120 may include first and second PMOS transistors T21, T22, first and second NMOS transistors T23, T24, and a current source 121. A drain terminal of the first PMOS transistor T21 may receive a supply voltage VDD, a gate terminal of the first PMOS transistor T21 may be connected to a first node N21, and a source terminal of the first PMOS transistor T21 may be connected to the first node N21. A drain terminal of the second PMOS transistor T22 may receive the supply voltage VDD, a gate terminal of the second PMOS transistor T22 may be connected to the first node N21, a source terminal of the second PMOS transistor T22 may be connected to a second node N22, and the first signal DSIG1 may be outputted from the second node N22.

A drain terminal of the first NMOS transistor T23 may be connected to the first node N21, a gate terminal of the first NMOS transistor T23 may receive the positive differential signal PSIG, and a source terminal of the first NMOS transistor T23 may be connected to a third node N23. A drain terminal of the second NMOS transistor T24 may be connected to the second node N22, a gate terminal of the second NMOS transistor T24 may receive the negative differential signal NSIG, and a source terminal of the second NMOS transistor T24 may be connected to the third node N23.

A terminal of the current source 121 may be connected to the third node N23 and the other terminal of the current source 121 may receive a ground voltage VSS. The current source 121 may have the same or similar structure with the current source 111 of FIG. 3.

Figure 5:
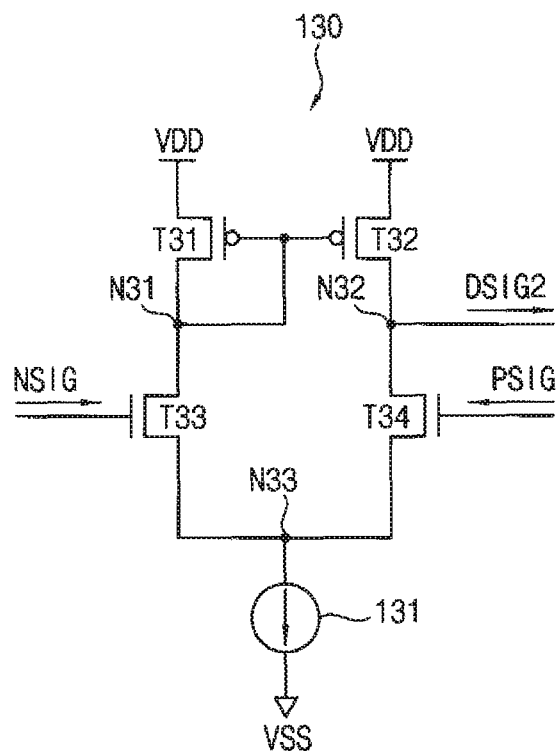
FIG. 5 is a circuit diagram illustrating the third differential amplifier included in the buffer circuit of FIG. 1.

FIG. 5 is a circuit diagram illustrating the third differential amplifier included in the buffer circuit of FIG. 1.

Referring to FIG. 5, the third differential amplifier 130 may include first and second PMOS transistors T31, T32, first and second NMOS transistors T33, T34, and a current source 131. A drain terminal of the first PMOS transistor T31 may receive a supply voltage VDD, a gate terminal of the first PMOS transistor T31 may be connected to a first node N31, and a source terminal of the first PMOS transistor T31 may be connected to the first node N31. A drain terminal of the second PMOS transistor T32 may receive the supply voltage VDD, a gate terminal of the second PMOS transistor T32 may be connected to the first node N31, and a source terminal of the second PMOS transistor T32 may be connected to a second node N32, and the second signal DSIG2 may be outputted from the second node N32. A drain terminal of the first NMOS transistor T33 may be connected to the first node N31, a gate terminal of the first NMOS transistor T33 may receive the negative differential signal NSIG, and a source terminal of the first NMOS transistor T33 may be connected to a third node N33. A drain terminal of the second NMOS transistor T34 may be connected to the second node N32, a gate terminal of the second NMOS transistor T34 may receive the positive differential signal PSIG, and a source terminal of the second NMOS transistor T34 may be connected to the third node N33.

A terminal of the current source 131 may be connected to the third node N33 and the other terminal of the current source 131 may receive a ground voltage VSS. The current source 131 may have the same or similar structure with the current source 111 of FIG. 3.

Figure 6:
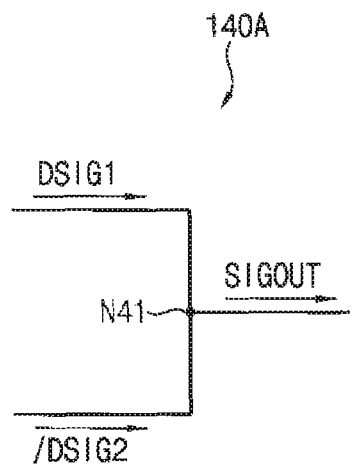
FIGS. 6 and 7 are circuit diagrams illustrating example embodiments of the internal mixer included in the buffer circuit of FIG. 1.
Figure 7:
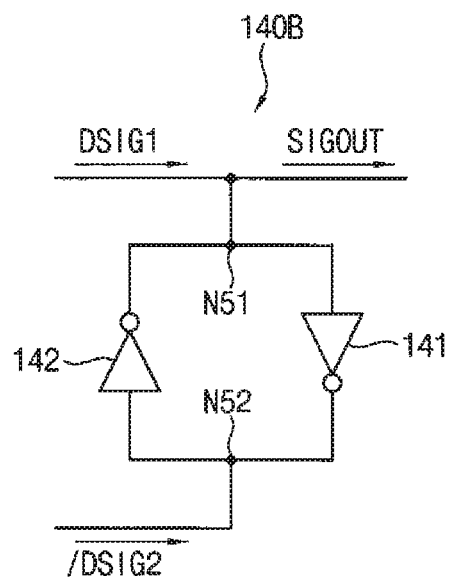

FIGS. 6 and 7 are circuit diagrams illustrating example embodiments of the internal mixer included in the buffer circuit of FIG. 1.

Referring to FIG. 6, in an example embodiment, the internal mixer 140A may include a first node N41. The first signal DSIG1 and the inverted second signal /DSIG2 may be provided to the first node N41 and the output signal SIGOUT may be outputted from the first node N41.

Referring to FIG. 7, in an example embodiment, the internal mixer 140B may include second and third inverters 141, 142. An input terminal of the second inverter 141 may be connected to a first node N51 and an output terminal of the second inverter 141 may be connected to a second node N52. An input terminal of the third inverter 142 may be connected to the second node N52 and an output terminal of the third inverter 142 may be connected to the first node N51. The first signal DSIG1 may be provided to the first node N51, the inverted second signal /DSIG2 may be provided to the second node N52, and the output signal SIGOUT may be outputted from the first node N51.

The second and third inverters 141, 142 may form a cross coupled latch, and generate the output signal SIGOUT by mixing the first signal DSIG1 and the inverted second signal /DSIG2. The signals will be described with the reference to FIG. 9.

Figure 8:
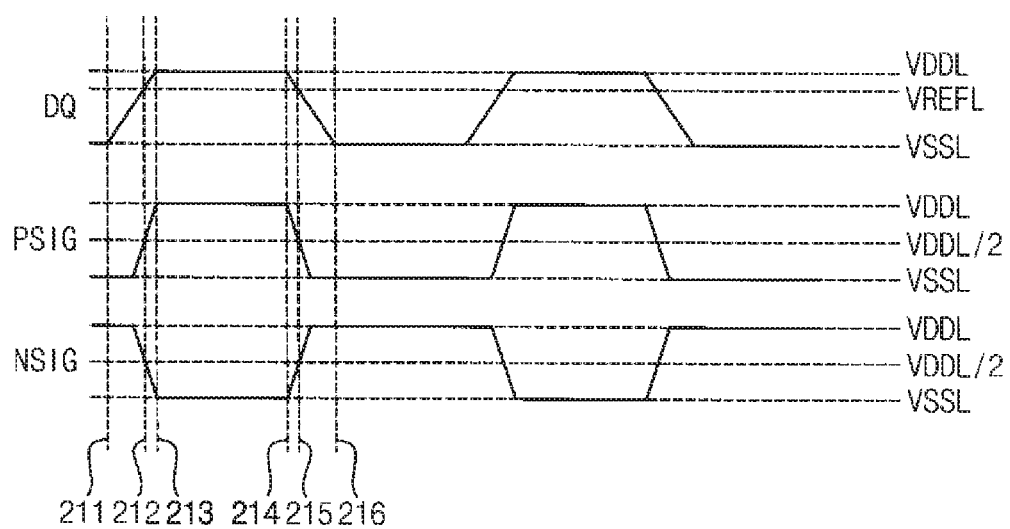
FIGS. 8 and 9 are timing diagrams illustrating operation of the buffer circuit of FIG. 1.
Figure 9:
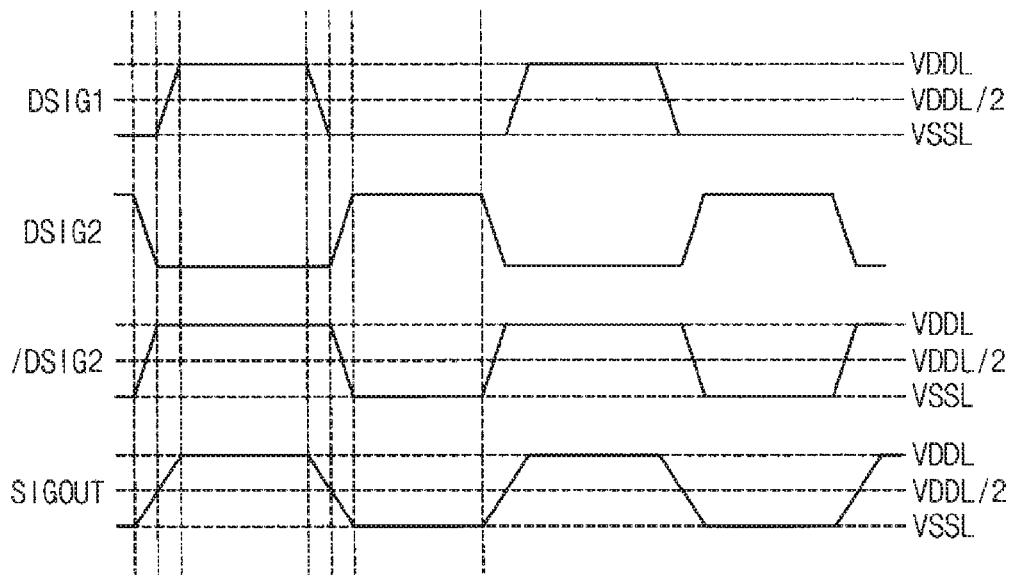

FIGS. 8 and 9 are timing diagrams illustrating operation of the buffer circuit of FIG. 1.

In ideal case, the reference voltage level VREFL has a medium voltage level VDDL/2 of the supply voltage level VDDL and the ground voltage level VSSL. However, the reference voltage level VREFL may not have the medium voltage level VDDL/2 because of the external environment. FIG. 8 shows a case that the reference voltage level VREFL does not have the medium voltage level VDDL/2.

From the first time point 211 to the second time point 212, the input signal DQ increases from the ground voltage level VSSL to the reference voltage level VREFL, the positive differential signal PSIG increases from the ground voltage level VSSL to the medium voltage level VDDL/2, and the negative differential signal NSIG decreases from the supply voltage level VDDL to the medium voltage level VDDL/2.

At the second time point 212, current driving power of the first NMOS transistor T11 becomes the same as the current driving power of the second NMOS transistor T12, and the positive differential signal PSIG and the negative differential signal NSIG have the medium voltage level VDDL/2.

From the second time point 212 to the third time point 213, the input signal DQ increases from the reference voltage level VREFL to the supply voltage level VDDL, the positive differential signal PSIG increases from the medium voltage level VDDL/2 to the supply voltage level VDDL, and the negative differential signal NSIG decreases from the medium voltage level VDDL/2 to the ground voltage level VSSL.

From the fourth time point 214 to the fifth time point 215, the input signal DQ decreases from the supply voltage level VDDL to the reference voltage level VREFL, the positive differential signal PSIG decreases from the supply voltage level VDDL to the medium voltage level VDDL/2, and the negative differential signal NSIG increases from the ground voltage level VSSL to the medium voltage level VDDL/2.

At the fifth time point 215, current driving power of the first NMOS transistor T11 becomes the same as the current driving power of the second NMOS transistor T12, and the positive differential signal PSIG and the negative differential signal NSIG have the medium voltage level VDDL/2.

From the fifth time point 215 to the sixth time point 216, the input signal DQ decreases from the reference voltage level VREFL to the ground voltage level VSSL, the positive differential signal PSIG decreases from the medium voltage level VDDL/2 to the ground voltage level VSSL, and the negative differential signal NSIG increases from the medium voltage level VDDL/2 to the supply voltage level VDDL.

As the reference voltage level VREFL increases, the duty of the input signal DQ is 50%, the duty of the positive differential signal PSIG becomes less than 50%, and the duty of the negative differential signal NSIG becomes greater than 50%.

Referring to FIG. 9, a difference between a phase of the first signal DSIG1 and a phase of the second signal DSIG2 is 180 degrees. The internal mixer 140 generates the output signal SIGOUT by mixing the first signal DSIG1 and the inverted second signal /DSIG2. The duty of the output signal SIGOUT is the same as the duty of the input signal DQ, 50%.

Figure 10:
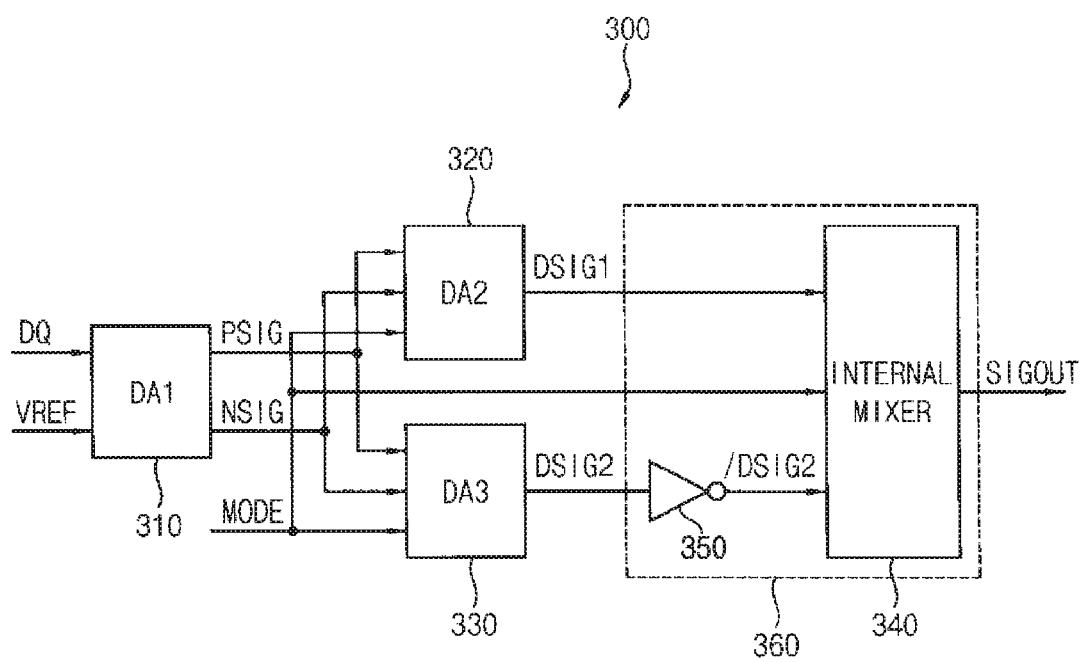
FIG. 10 is a block diagram illustrating a buffer circuit according to another example embodiment.

FIG. 10 is a block diagram illustrating a buffer circuit according to another example embodiment.

Referring to FIG. 10, a buffer circuit 300 includes a first differential amplifier DA1 310, a second differential amplifier DA2 320, a third differential amplifier DA3 330, and a mixer 360. The mixer includes a first inverter 350 and an internal mixer 340.

The first differential amplifier 310 generates a positive differential signal PSIG and a negative differential signal NSIG based on an input signal DQ and a reference voltage signal VREF. In an example embodiment, the first differential amplifier 310 may be embodied with the first differential amplifier 110 of FIG. 2. The second differential amplifier 320 generates a first signal DSIG1 based on the positive differential signal PSIG and the negative differential signal NSIG. The second differential amplifier 320 drives the first signal DSIG1 as a first current amount when a mode signal MODE is deactivated. The second differential amplifier 320 drives the first signal DSIG1 as a second current amount, which is a half of the first current amount, when the mode signal MODE is activated. The third differential amplifier 330 stops operating when the mode signal MODE is deactivated. The third differential amplifier 330 generates a second signal DSIG2, which has the second current amount and has a different phase from the first signal DSIG1, based on the positive differential signal PSIG and the negative differential signal NSIG when the mode signal MODE is activated. The mixer 360 outputs the first signal DSIG1 as an output signal SIGOUT when the mode signal MODE is deactivated. The mixer 360 outputs a signal, generated by mixing the first signal DSIG1 and the second signal DSIG2, as the output signal SIGOUT when the mode signal MODE is activated.

The first inverter 350 generates the inverted second signal /DSIG2 by inverting the second signal DSIG2. The internal mixer 340 generates the output signal SIGOUT by mixing the first signal DSIG1 and the inverted second signal /DSIG2.

The buffer circuit 300 generates the output signal SIGOUT by conventional differential amplification when the mode signal MODE is deactivated. The buffer circuit 300 may maintain a difference between a duty of the output signal SIGOUT and a duty of the input signal DQ within a certain range by cancelling duty variations of the positive differential signal PSIG and the negative differential signal NSIG through the mixing when a level of the reference voltage signal VREF is varied and the mode signal MODE is activated. Preferably, the buffer circuit 300 may maintain the difference between the duty of the output signal SIGOUT and the duty of the input signal DQ within 2%.

Difference between a phase of the first signal DSIG1 and a phase of the second signal DSIG2 may be 180 degrees. The first inverter 350 may generate the inverted second signal /DSIG2 having the same current amount as the second signal DSIG2.

The mode signal MODE may be deactivated when a difference between a voltage level of the reference voltage signal VREF and a half of a supply voltage level is equal to or less than a pre-determined reference. The mode signal MODE may be activated when the difference is larger than the pre-determined reference. In an example embodiment, if the pre-determined reference is 10% of the supply voltage level, the mode signal MODE may be deactivated when the difference is equal to or less than 10% of the supply voltage level, and the mode signal MODE may be activated when the difference is larger than 10% of the supply voltage level.

Figure 11:
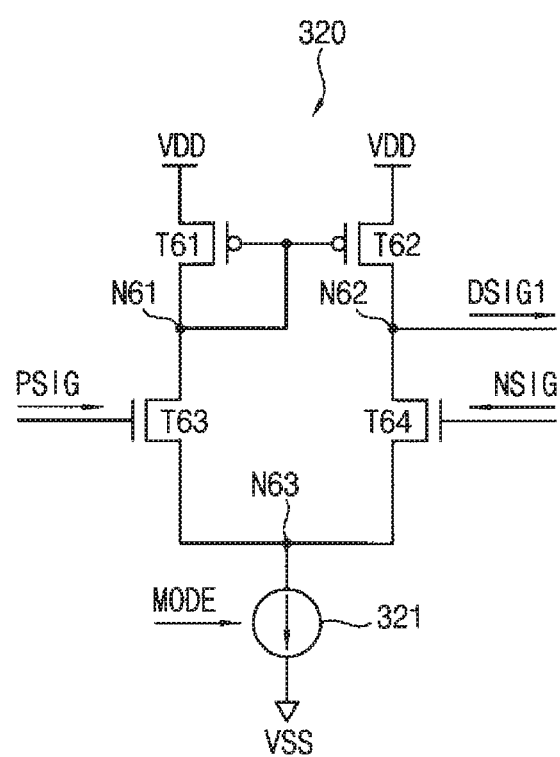
FIG. 11 is a circuit diagram illustrating the second differential amplifier included in the buffer circuit of FIG. 10.

FIG. 11 is a circuit diagram illustrating the second differential amplifier included in the buffer circuit of FIG. 10.

Referring to FIG. 11, the second differential amplifier 320 may include first and second PMOS transistors T61, T62, first and second NMOS transistors T63, T64, and a current source 321.

A drain terminal of the first PMOS transistor T61 may receive a supply voltage VDD, a gate terminal of the first PMOS transistor T61 may be connected to a first node N61, and a source terminal of the first PMOS transistor T61 may be connected to the first node N61. A drain terminal of the second PMOS transistor T62 may receive the supply voltage VDD, a gate terminal of the second PMOS transistor T62 may be connected to the first node N61, a source terminal of the second PMOS transistor T62 may be connected to a second node N62, and the first signal DSIG1 may be outputted from the second node N62.

A drain terminal of the first NMOS transistor T63 may be connected to the first node N61, a gate terminal of the first NMOS transistor T63 may receive the positive differential signal PSIG, and a source terminal of the first NMOS transistor T63 may be connected to a third node N63. A drain terminal of the second NMOS transistor T64 may be connected to the second node N62, a gate terminal of the second NMOS transistor T64 may receive the negative differential signal NSIG, and a source terminal of the second NMOS transistor T64 may be connected to the third node N63.

A terminal of the current source 321 may be connected to the third node N63, the other terminal of the current source 321 may receive a ground voltage VSS, the current source 321 may generate a current having the first current amount when the mode signal MODE is deactivated, and the current source 321 may generate the current having the second current amount when the mode signal MODE is activated.

As the result, the second differential amplifier 320 drives the first signal DSIG1 as the first current amount when the mode signal MODE is deactivated and the second differential amplifier 320 drives the first signal DSIG1 as the second current amount when the mode signal MODE is activated.

Figure 12:
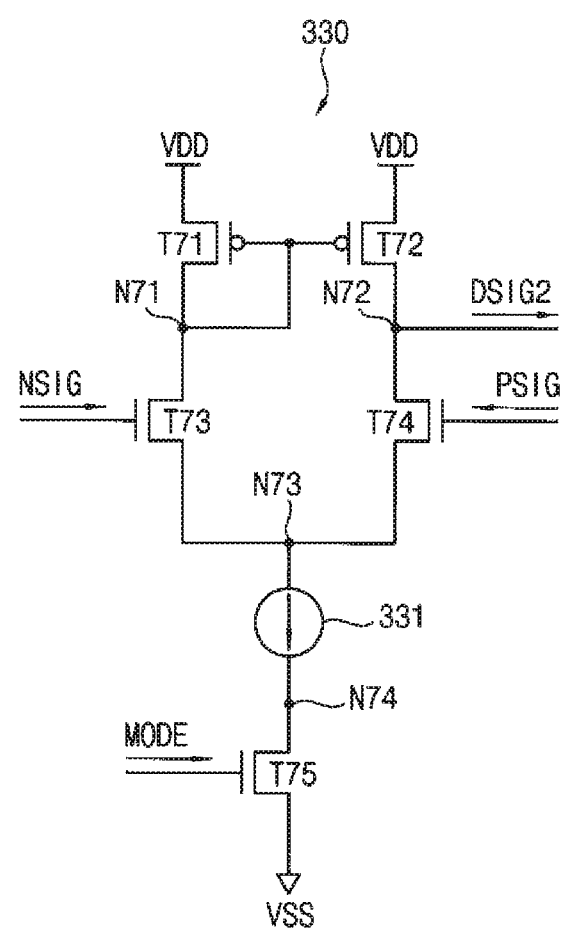
FIG. 12 is a circuit diagram illustrating the third differential amplifier included in the buffer circuit of FIG. 10.

FIG. 12 is a circuit diagram illustrating the third differential amplifier included in the buffer circuit of FIG. 10.

Referring to FIG. 12, the third differential amplifier 330 may include first and second PMOS transistors T71, T72, first through third NMOS transistors T73, T74, and T75, and a current source 331.

A drain terminal of the first NMOS transistor T71 may receive a supply voltage VDD, a gate terminal of the first PMOS transistor T71 may be connected to a first node N71, and a source terminal of the first PMOS transistor T71 may be connected to the first node N71. A drain terminal of the second PMOS transistor T72 may receive the supply voltage VDD, a gate terminal of the second PMOS transistor T72 may be connected to the first node N71, a source terminal of the second PMOS transistor T72 may be connected to a second node N72, and the second signal DSIG2 may be outputted from the second node N72.

A drain terminal of the first NMOS transistor T73 may be connected to the first node N71, a gate terminal of the first NMOS transistor T73 may receive the negative differential signal NSIG, and a source terminal of the first NMOS transistor T73 may be connected to a third node N73. A drain terminal of the second NMOS transistor T74 may be connected to the second node N72, a gate terminal of the second NMOS transistor T74 may receive the positive differential signal PSIG, and a source terminal of the second NMOS transistor T74 may be connected to the third node N73. A terminal of the current source 331 may be connected to the third node N73 and the other terminal of the current source 331 may be connected to a fourth node N74. A drain terminal of the third NMOS transistor T75 may be connected to the fourth node N74, a gate terminal of the third NMOS transistor T75 may receive the mode signal MODE, and a source terminal of the third NMOS transistor T75 may receive a ground voltage VSS.

As the result, the third NMOS transistor T75 is turned-off and the third differential amplifier 330 does not work when the mode signal MODE is deactivated. The third NMOS transistor T75 is turned-on and the third differential amplifier 330 generates the second signal DSIG2, which has the second current amount and has a different phase from the first signal DSIG1, based on the positive differential signal PSIG and the negative differential signal NSIG when the mode signal MODE is activated.

Figure 13:
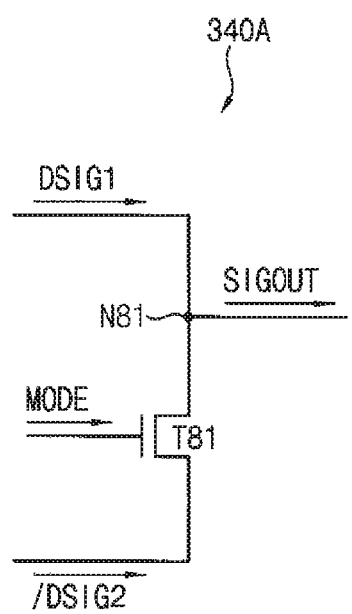
FIGS. 13 and 14 are circuit diagrams illustrating example embodiments of the internal mixer included in the buffer circuit of FIG. 10.
Figure 14:
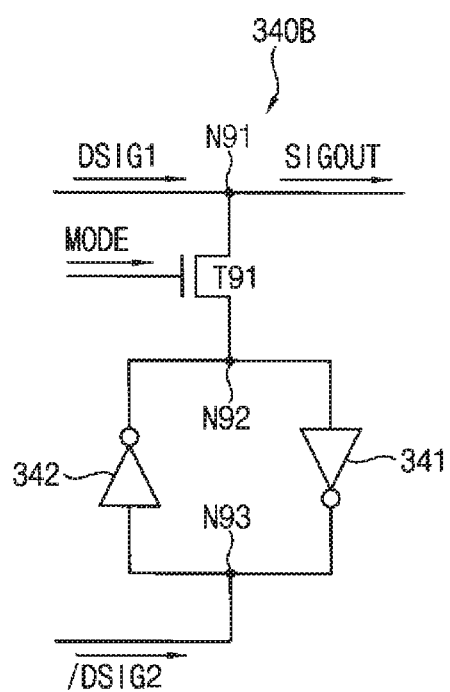

FIGS. 13 and 14 are circuit diagrams illustrating example embodiments of the internal mixer included in the buffer circuit of FIG. 10.

Referring to FIG. 13, in an example embodiment, the internal mixer 340A may include a NMOS transistor T81. The first signal DSIG1 may be provided to the first node N81, a drain terminal of the NMOS transistor T81 may be connected to the first node N81, a gate terminal of the NMOS transistor T81 may receive the mode signal MODE, a source terminal of the NMOS transistor T81 may receive the inverted second signal /DSIG2, and the output signal SIGOUT may be outputted from the first node N81.

As the result, the NMOS transistor T81 is turned-off and the internal mixer 340A outputs the first signal DSIG1 as the output signal SIGOUT when the mode signal MODE is deactivated. The NMOS transistor T81 is turned-on and the internal mixer 340A outputs a signal, generated by mixing the first signal DSIG1 and the inverted second signal /DSIG2 as the output signal SIGOUT when the mode signal MODE is activated.

Referring to FIG. 14, in an example embodiment, the internal mixer 340B may include a NMOS transistor T91 and second and third inverters 341, 342. A drain terminal of the NMOS transistor T91 is connected to the first node N91, a gate terminal of the NMOS transistor T91 receives the mode signal MODE, and a source terminal of the NMOS transistor T91 is connected to the second node N92. An input terminal of the second inverter 341 is connected to the second node N92, an output terminal of the second inverter 341 is connected to the third node N93, an input terminal of the third inverter 342 is connected to the third node N93, an output terminal of the third inverter 342 is connected to the second node N92, the first signal DSIG1 is provided to the first node N91, the inverted second signal /DSIG2 is provided to the third node N93, and the output signal SIGOUT is outputted from the first node N91.

As the result, the NMOS transistor T91 is turned-off and the internal mixer 340B outputs the first signal DSIG1 as the output signal SIGOUT when the mode signal MODE is deactivated. The NMOS transistor T91 is turned-on and the internal mixer 340B outputs a signal, generated by mixing the first signal DSIG1 and the inverted second signal /DSIG2 as the output signal SIGOUT when the mode signal MODE is activated.

Figure 15:
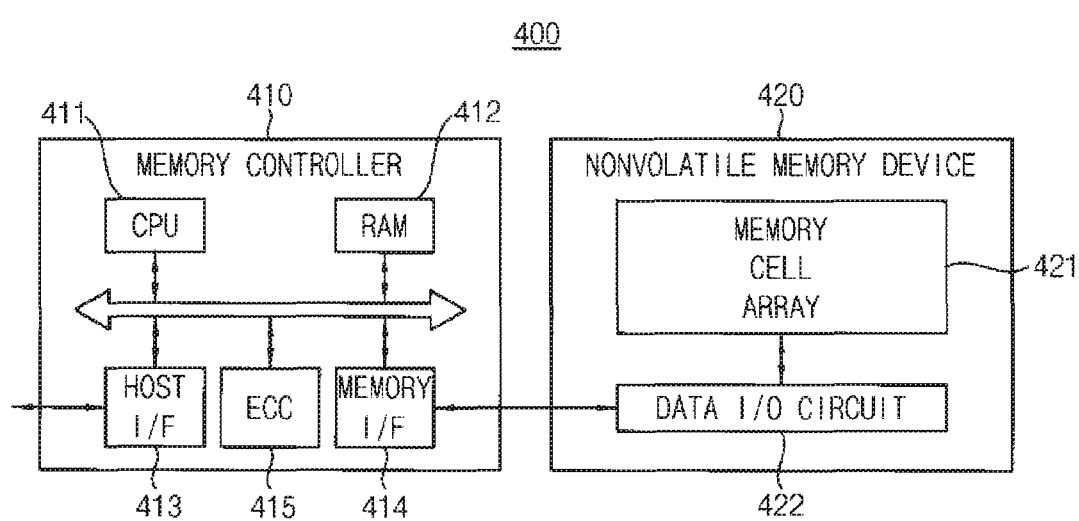
FIG. 15 is a block diagram illustrating a memory system according to an example embodiment.

FIG. 15 is a block diagram illustrating a memory system according to an example embodiment.

Referring to FIG. 15, a memory system 400 includes a memory controller 410 and a nonvolatile memory device 420.

The nonvolatile memory device 420 includes a memory cell array 421 and a data I/O circuit 422.

The memory cell array 421 is formed on a substrate in a three-dimensional structure. For example, memory cells included in the memory cell array 421 may be formed in a direction perpendicular to the substrate. The memory cells included in the memory cell array 421 may be connected to a plurality of word lines, which are stacked in a direction perpendicular to the substrate, and a plurality of bit lines, which are formed in a direction parallel to the substrate.

The data I/O circuit 422 is connected to the memory cell array 421 through the plurality of bit lines. The data I/O circuit 422 may select at least one of the plurality of bit lines, output data read from a memory cell connected to the selected at least one bit line to the memory controller 410, and write data received from the memory controller 410 in a memory cell connected to the selected at least one bit line. The data I/O circuit 422 may include the buffer circuit 100 of FIG. 1 or the buffer circuit 300 of FIG. 10.

The memory controller 410 may control the nonvolatile memory device 420. The memory controller 410 may control data transfer between an external host and the nonvolatile memory device 420.

The memory controller 410 may include a central processing unit 411, a buffer memory 412, a host interface 413 and a memory interface 414.

The central processing unit 411 may perform operations for the data transfer. The buffer memory 412 may be implemented by a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

The buffer memory 412 may be an operational memory of the central processing unit 411. In some example embodiments, the buffer memory 412 may be included in the memory controller 410. In other example embodiments, the buffer memory 412 may be outside of the memory controller 410.

The host interface 413 may be coupled to the host, and the memory interface 414 may be coupled to the nonvolatile memory device 420. The central processing unit 411 may communicate with the host via the host interface 413. For example, the host interface 413 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on.

Further, the central processing unit 411 may communicate with the nonvolatile memory device 420 via the memory interface 414. The host interface 413 and the memory interface 414 may include the buffer circuit 100 of FIG. 1 or the buffer circuit 300 of FIG. 10.

In some example embodiments, the memory controller 410 may further include a non-volatile memory device storing a start-up code. The memory controller 410 may further include an error correction block 415 for error correction.

In some example embodiments, the memory controller 410 may be built in the nonvolatile memory device 420, or the memory controller 410 and the nonvolatile memory device 420 may be implemented as separate chips.

The memory system 400 may be implemented as a memory card, a solid state drive, and so on.

Figure 16:
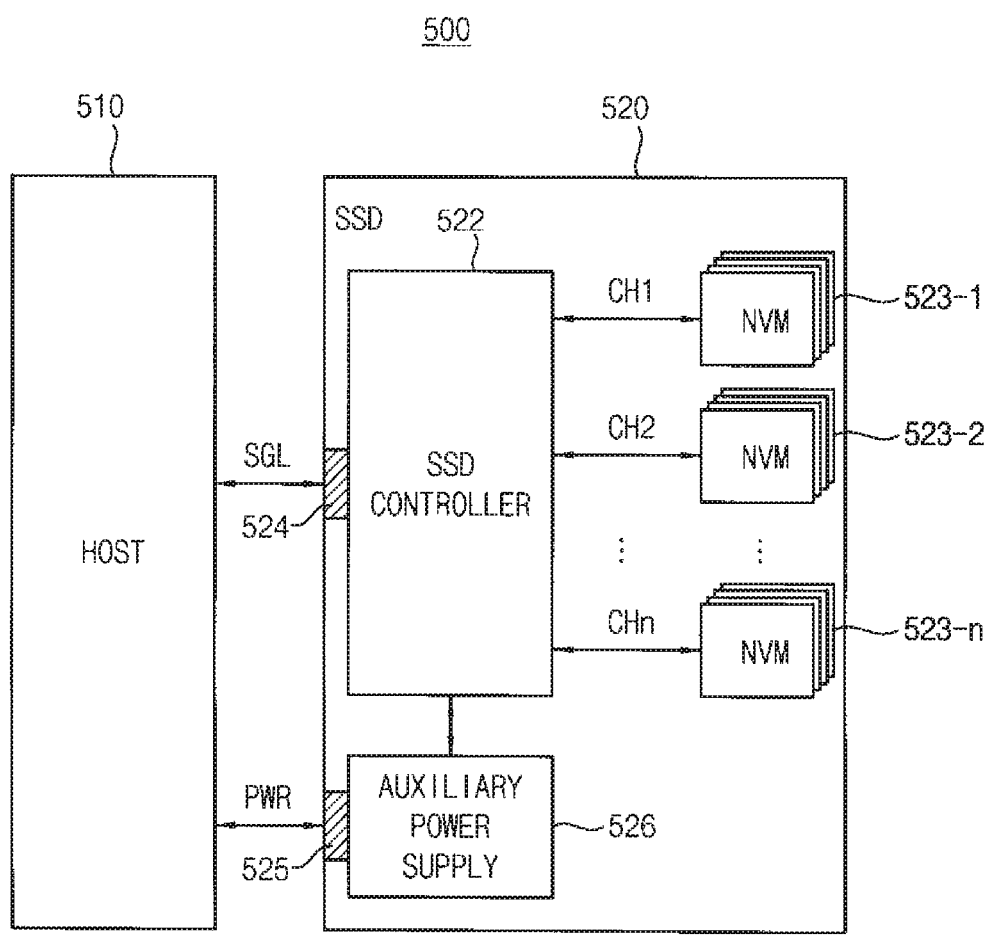
FIG. 16 is a block diagram illustrating a solid state drive (SSD) system according to an example embodiment.

FIG. 16 is a block diagram illustrating a solid state drive (SSD) system according to an example embodiment.

Referring to FIG. 16, an SSD system 500 includes a host 510 and an SSD 520.

The SSD 500 includes first through n-th nonvolatile memory devices 523-1, 523-2, . . . , 523-n and an SSD controller 522. Here, n represents an integer greater than or equal to two.

The first through n-th nonvolatile memory devices 523-1, 523-2, . . . , 523-n may be used as a storage medium of the SSD 520.

Each of the first through n-th nonvolatile memory devices 523-1, 523-2, . . . , 523-n may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The SSD controller 520 is coupled to the first through n-th nonvolatile memory devices 523-1, 523-2, . . . , 523-n by first through n-th channels CH1, CH2, . . . , CHn, respectively.

The SSD controller 520 may exchange a signal SGL with the host 510 through a signal connector 524. The signal SGL may include a command, an address and data. The SSD controller 520 may perform a program operation and a read operation on the first through n-th nonvolatile memory devices 523-1, 523-2, . . . , 523-n according to the command received from the host 510. The host 510 and the signal connector 524 may include the buffer circuit 100 of FIG. 1 or the buffer circuit 300 of FIG. 10.

The SSD 520 may further include an auxiliary power supply 526. The auxiliary power supply 526 may receive power PWR from the host 510 through a power connector 525 and provide power to the SSD controller 520. The auxiliary power supply 526 may be placed inside or outside the SSD 520. For example, the auxiliary power supply 526 may be placed in a main board and provide auxiliary power to the SSD 520.

Figure 17:
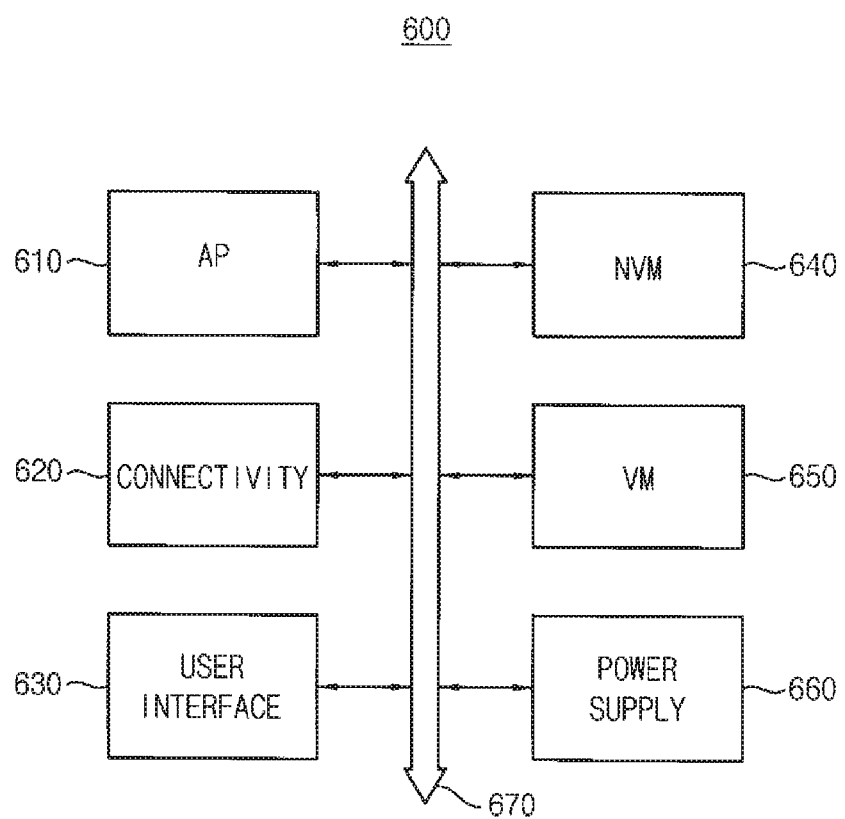
FIG. 17 is a block diagram illustrating a mobile system according to an example embodiment.

FIG. 17 is a block diagram illustrating a mobile system according to an example embodiment.

Referring to FIG. 17, a mobile system 600 includes an application processor AP 610, a connectivity unit 620, a user interface 630, a nonvolatile memory device NVM 640, a volatile memory device VM 650, a power supply 660, and a bus 670.

In some embodiments, the mobile system 600 may be a mobile phone, a smart phone, a personal digital assistant (PDA), a portable multimedia player (PMP), a digital camera, a music player, a portable game console, a navigation system, etc.

The application processor 610 may execute applications, such as a web browser, a game application, a video player, etc. In some example embodiments, the application processor 610 may include a single core or multiple cores. For example, the application processor 610 may be a multi-core processor, such as a dual-core processor, a quad-core processor, a hexa-core processor, etc. The application processor 610 may include an internal or external cache memory.

The connectivity unit 620 may perform wired or wireless communication with an external device. For example, the connectivity unit 620 may perform Ethernet communication, near field communication (NFC), radio frequency identification (RFID) communication, mobile telecommunication, memory card communication, universal serial bus (USB) communication, etc. In some embodiments, the connectivity unit 620 may include a baseband chipset that supports communications, such as global system for mobile communications (GSM), general packet radio service (GPRS), wideband code division multiple access (WCDMA), high speed downlink/uplink packet access (HSxPA), etc.

The nonvolatile memory device 640 may store a boot image for booting the mobile system 600.

The nonvolatile memory device 640 may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The volatile memory device 650 may store data processed by the application processor 610, or may operate as a working memory.

The user interface 630 may include at least one input device, such as a keypad, a touch screen, etc., and at least one output device, such as a speaker, a display device, etc.

The power supply 660 may supply a power supply voltage to the mobile system 600.

The application processor 610, the connectivity unit 620, the user interface 630, the nonvolatile memory device 640, the volatile memory device 650, and the power supply 660 may be interconnected each other through the bus 670. The application processor 610, the connectivity unit 620, the user interface 630, the nonvolatile memory device 640, the volatile memory device 650, the power supply 660, and the bus 670 may include the buffer circuit of FIG. 1 or the buffer circuit 300 of FIG. 10.

In some embodiments, the mobile system 600 may further include an image processor, and/or a storage device, such as a memory card, a solid state drive (SSD), a hard disk drive (HDD), a CD-ROM, etc.

In some embodiments, the mobile system 600 and/or components of the mobile system 600 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A buffer circuit comprising:
   a first differential amplifier configured to generate a positive differential signal and a negative differential signal based on an input signal and a reference voltage signal;
   a second differential amplifier configured to generate a first signal based on the positive differential signal and the negative differential signal;
   a third differential amplifier configured to generate a second signal having a different phase from the first signal based on the positive differential signal and the negative differential signal; and
   a mixer configured to output a signal, generated by mixing the first signal and the second signal, as an output signal, wherein
   the buffer circuit maintains a difference between a duty of the output signal and a duty of the input signal within a certain range by cancelling duty variations of the positive differential signal and the negative differential signal through the mixing when a level of the reference voltage signal is varied.

2. The buffer circuit of claim 1, wherein a difference between a phase of the first signal and a phase of the second signal is 180 degrees.

3. The buffer circuit of claim 1, wherein the mixer includes:
   a first inverter configured to generate an inverted second signal by inverting the second signal; and
   an internal mixer configured to generate the output signal by mixing the first signal and the inverted second signal.

4. The buffer circuit of claim 1, wherein:
   the first differential amplifier includes first and second NMOS transistors, first and second resistors, and a current source,
   a terminal of the first resistor receives a supply voltage, the other terminal of the first resistor is connected to a first node, a terminal of the second resistor receives the supply voltage, the other terminal of the second resistor is connected to a second node, the negative differential signal is outputted from the first node, and the positive differential signal is outputted from the second node,
   a drain terminal of the first NMOS transistor is connected to the first node, a gate terminal of the first NMOS transistor receives the input signal, and a source terminal of the first NMOS transistor is connected to a third node,
   a drain terminal of the second NMOS transistor is connected to the second node, a gate terminal of the second NMOS transistor receives the reference voltage signal, and a source terminal of the second NMOS transistor is connected to the third node, and
   a terminal of the current source is connected to the third node and another terminal of the current source receives a ground voltage.

5. The buffer circuit of claim 4, wherein:
   the current source includes a third NMOS transistor, and
   a drain terminal of the third NMOS transistor is connected to the third node, a gate terminal of the third NMOS transistor receives a bias voltage signal, and a source terminal of the third NMOS transistor receives the ground voltage.

6. The buffer circuit of claim 1, wherein:
   the second differential amplifier includes first and second PMOS transistors, first and second NMOS transistors, and a current source,
   a drain terminal of the first PMOS transistor receives a supply voltage, a gate terminal of the first PMOS transistor is connected to a first node, and a source terminal of the first PMOS transistor is connected to the first node,
   a drain terminal of the second PMOS transistor receives the supply voltage, a gate terminal of the second PMOS transistor is connected to the first node, a source terminal of the second PMOS transistor is connected to a second node, and the first signal is outputted from the second node,
   a drain terminal of the first NMOS transistor is connected to the first node, a gate terminal of the first NMOS transistor receives the positive differential signal, and a source terminal of the first NMOS transistor is connected to a third node,
   a drain terminal of the second NMOS transistor is connected to the second node, a gate terminal of the second NMOS transistor receives the negative differential signal, and a source terminal of the second NMOS transistor is connected to the third node, and a terminal of the current source is connected to the third node and the other terminal of the current source receives a ground voltage.

7. The buffer circuit of claim 1, wherein:
the third differential amplifier includes first and second PMOS transistors, first and second NMOS transistors, and a current source,
a drain terminal of the first PMOS transistor receives a supply voltage, a gate terminal of the first PMOS transistor is connected to a first node, and a source terminal of the first PMOS transistor is connected to the first node,
a drain terminal of the second PMOS transistor receives the supply voltage, a gate terminal of the second PMOS transistor is connected to the first node, and a source terminal of the second PMOS transistor is connected to a second node, and the second signal is outputted from the second node,
a drain terminal of the first NMOS transistor is connected to the first node, a gate terminal of the first NMOS transistor receives the negative differential signal, and a source terminal of the first NMOS transistor is connected to a third node,
a drain terminal of the second NMOS transistor is connected to the second node, a gate terminal of the second NMOS transistor receives the positive differential signal, and a source terminal of the second NMOS transistor is connected to the third node, and
a terminal of the current source is connected to the third node and the other terminal of the current source receives a ground voltage.

8. A buffer circuit comprising:
a first differential amplifier configured to generate a positive differential signal and a negative differential signal based on an input signal and a reference voltage signal;
a second differential amplifier configured to generate a first signal based on the positive differential signal and the negative differential signal, configured to drive the first signal as a first current amount when a mode signal is deactivated, configured to drive the first signal as a second current amount, which is a half of the first current amount, when the mode signal is activated;
a third differential amplifier configured to stop operating when the mode signal is deactivated, configured to generate a second signal, which has the second current amount and has a different phase from the first signal, based on the positive differential signal and the negative differential signal when the mode signal is activated; and
a mixer configured to output the first signal as an output signal when the mode signal is deactivated, configured to output a signal, generated by mixing the first signal and the second signal, as the output signal when the mode signal is activated.

9. The buffer circuit of claim 8, wherein the buffer circuit maintains a difference between a duty of the output signal and a duty of the input signal within a certain range by cancelling duty variations of the positive differential signal and the negative differential signal through the mixing when a level of the reference voltage signal is varied and the mode signal is activated.

10. The buffer circuit of claim 8, wherein the mixer includes:
a first inverter configured to generate an inverted second signal by inverting the second signal; and
an internal mixer configured to generate the output signal by mixing the first signal and the inverted second signal.

11. The buffer circuit of claim 10, wherein:
the internal mixer includes an NMOS transistor, and
the first signal is provided to a first node, a drain terminal of the NMOS transistor is connected to the first node, a gate terminal of the NMOS transistor receives the mode signal, a source terminal of the NMOS transistor receives the inverted second signal, and the output signal is outputted from the first node.

12. The buffer circuit of claim 10, wherein:
the internal mixer includes an NMOS transistor and second and third inverters,
a drain terminal of the NMOS transistor is connected to a first node, a gate terminal of the NMOS transistor receives the mode signal, and a source terminal of the NMOS transistor is connected to a second node,
an input terminal of the second inverter is connected to the second node and an output terminal of the second inverter is connected to a third node,
an input terminal of the third inverter is connected to the third node and an output terminal of the third inverter is connected to the second node,
the first signal is provided to the first node, the inverted second signal is provided to the third node, and the output signal is outputted from the first node,
the first inverter generates the inverted second signal having the same current amount as the second signal, and
a difference between a phase of the first signal and a phase of the second signal is 180 degrees.

13. The buffer circuit of claim 8, wherein:
the second differential amplifier includes first and second PMOS transistors, first and second NMOS transistors, and a current source,
a drain terminal of the first PMOS transistor receives a supply voltage, a gate terminal of the first PMOS transistor is connected to a first node, and a source terminal of the first PMOS transistor is connected to the first node,
a drain terminal of the second PMOS transistor receives the supply voltage, a gate terminal of the second PMOS transistor is connected to the first node, a source terminal of the second PMOS transistor is connected to a second node, and the first signal is outputted from the second node,
a drain terminal of the first NMOS transistor is connected to the first node, a gate terminal of the first NMOS transistor receives the positive differential signal, and a source terminal of the first NMOS transistor is connected to a third node,
a drain terminal of the second NMOS transistor is connected to the second node, a gate terminal of the second NMOS transistor receives the negative differential signal, and a source terminal of the second NMOS transistor is connected to the third node, and
a terminal of the current source is connected to the third node, the other terminal of the current source receives a ground voltage, the current source generates a current having the first current amount when the mode signal is deactivated, and the current source generates the current having the second current amount when the mode signal is activated.

14. The buffer circuit of claim 8, wherein:

the third differential amplifier includes first and second PMOS transistors, first through third NMOS transistors, and a current source, a drain terminal of the first NMOS transistor receives a supply voltage, a gate terminal of the first PMOS transistor is connected to a first node, and a source terminal of the first PMOS transistor is connected to the first node, a drain terminal of the second PMOS transistor receives the supply voltage, a gate terminal of the second PMOS transistor is connected to the first node, a source terminal of the second PMOS transistor is connected to a second node, and the second signal is outputted from the second node, a drain terminal of the first NMOS transistor is connected to the first node, a gate terminal of the first NMOS transistor receives the negative differential signal, and a source terminal of the first NMOS transistor is connected to a third node, a drain terminal of the second NMOS transistor is connected to the second node, a gate terminal of the second NMOS transistor receives the positive differential signal, and a source terminal of the second NMOS transistor is connected to the third node, a terminal of the current source is connected to the third node and the other terminal of the current source is connected to a fourth node, and a drain terminal of the third NMOS transistor is connected to the fourth node, a gate terminal of the third NMOS transistor receives the mode signal, and a source terminal of the third NMOS transistor receives a ground voltage.

15. A buffer circuit comprising:

a differential amplifier that generates a positive differential signal and a negative differential signal based on an input signal and a reference signal;

a first buffering component that receives the positive and negative differential signals and outputs a first buffered signal based on the received positive and negative differential signals;

a second buffering component that receives the positive and negative differential signals and outputs a second buffered signal based on the received positive and negative differential signals; and a combiner that combines the magnitudes of the first and second buffered signals to produce an output signal, wherein:

the first buffered signal has a first amount of current for a first mode of operation and a second amount of current for a second mode of operation, and the second buffered signal has the first amount of current for the first mode of operation and a third amount of current for the second mode of operation.

16. The buffer circuit of claim 15, wherein the combiner inverts one of the first and second buffered signals to produce an inverted signal and combines the inverted signal and the non-inverted one of the first and second buffered signals to produce the output signal.

17. The buffer circuit of claim 15, wherein the combiner produces the output signal based on an average of the magnitudes of the electrical currents within the first and second buffered signals.

18. The buffer circuit of claim 15, wherein the first amount of current is about one-half the second amount of current and the third current is about zero current.

* * * * *